US006921907B2

United States Patent
Vanderpot et al.

(10) Patent No.: US 6,921,907 B2
(45) Date of Patent: *Jul. 26, 2005

(54) SUBSTRATE POSITIONING SYSTEM

(75) Inventors: John W. Vanderpot, Boxford, MA (US); Donald W. Berrian, Topsfield, MA (US); John D. Pollock, Rowley, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/889,193

(22) Filed: Jul. 12, 2004

(65) Prior Publication Data

US 2004/0245480 A1 Dec. 9, 2004

Related U.S. Application Data

(63) Continuation of application No. 10/153,114, filed on May 21, 2002, now Pat. No. 6,777,687, which is a continuation of application No. 10/081,610, filed on Feb. 20, 2002, now abandoned.
(60) Provisional application No. 60/270,644, filed on Feb. 20, 2001.

(51) Int. Cl.$^7$ .............................................. H01J 37/20
(52) U.S. Cl. ............................. 250/442.11; 250/492.21
(58) Field of Search ...................... 250/442.11, 492.21, 250/492.2

(56) References Cited

U.S. PATENT DOCUMENTS 5,895,923 A * 4/1999 Blake .................. 250/492.21
6,777,687 B2 * 8/2004 Vanderpot et al. ..... 250/442.11

* cited by examiner

Primary Examiner—Jack I. Berman
(74) Attorney, Agent, or Firm—Lathrop & Gage, L.C.

(57) ABSTRACT

A substrate positioning system is provided to facilitate the performing of certain processing on the substrate, such as ion implantation. The system comprises a linkage rotatably mounted to a base and an end effector member rotatably mounted to the linkage and configured for receiving a substrate. Through the synchronized rotation of the linkage about the base and the end effector member about the linkage, the system acts as a robotic unit to move the substrate to the desired location for performing processing thereon. In another aspect, the base is movable along an axis such that the system maintains a constant distance of travel for an ion beam incident on the substrate as the linkage and end effector member travel in a curved path.

16 Claims, 2 Drawing Sheets

SUBSTRATE POSITIONING SYSTEM

RELATED APPLICATIONS

This application is a continuation of U.S. patent application Ser. No. 10/153,114, filed May 21, 2002 U.S. Pat. No. 6,777,687, entitled "SUBSTRATE POSITIONING SYSTEM", which is a continuation of U.S. patent application Ser. No. 10/081,610, filed Feb. 20, 2002 abandoned, entitled "SUBSTRATE POSITIONING SYSTEM", which claims priority to U.S. provisional patent application Ser. No. 60/270,644, filed Feb. 20, 2001, entitled "ROBUST MECHANICAL SCAN ROBOT FOR AN ION IMPLANTER WITH A SINGLE ROTARY LINKAGE", incorporated herein by reference.

BACKGROUND OF THE INVENTION

This invention relates generally to positioning mechanisms, and more particularly, to a substrate positioning system facilitating the performing of certain processing on the substrate, such as ion implantation.

DESCRIPTION OF RELATED ART

Robotic units and other positioning mechanisms are known for performing certain controlled tasks. With respect to mechanisms for assisting in ion implantation on a substrate, such as a semiconducting wafer, a mechanical scanning apparatus has been used in conjunction with ion implanters to ensure that ion beams incident on the substrate reach the whole surface area. The ion implanters typically scan the ion beam electrically in a first axis across the substrate surface and utilize the mechanical scanning apparatus to scan the substrate mechanically along a second axis perpendicular to the first. The mechanical scan is necessary due to the difficulty of electrically scanning the beam over a large area of the substrate while keeping the angle of incidence of the beam to the substrate surface constant. Additionally, the mechanical scan must move the substrate at a certain velocity and at the correct angle of incidence as to avoid ion dosage and substrate depth non-uniformities.

Nogami et al., in U.S. Pat. No. 5,003,183, describe a mechanism that swings a wafer through the beam by rotating its holder from the side. Although this mechanism maintains a constant impact point of the ion beam with the wafer tilted at an angle of incidence, the wafer rotation must be coordinated with the scan to avoid velocity variation across the wafer and resulting ion dosage variations.

Brune et al., in U.S. Pat. No. 5,229,615, describe a two-link robot arm for mechanically scanning a wafer. This device requires the coordination of three rotary axes to maintain the angle of incidence at a constant value as the wafer is scanned, thus adding additional complexity of motion.

Thus, what is desired is a substrate positioning system that can accurately move a substrate to desired positions for performing certain processing thereon while having a reduced complexity of motion. In ion implantation, the system should mechanically scan the wafer through the ion beam at a constant angle of incidence while maintaining the ion dosage reaching the wafer surface at relatively constant values.

SUMMARY OF THE INVENTION

It is a feature of the present invention to provide a substrate positioning system to facilitate the performing of certain processing on the substrate, such as ion implantation. It is another feature to provide such a system with rotatable members synchronized to form a robotic unit to efficiently and accurately move the substrate to a desired range of motion. It is yet another feature to provide such a system with a base movable linearly along an axis such that the system maintains a constant distance of travel for an ion beam incident on the substrate as the rotatable members travel in a curved path. It is yet another feature of the present invention to provide such a system where the rotatable members simultaneously rotate to maintain a substantially constant incident angle of the substrate relative to the ion beam. It is yet another feature of the present invention to provide such a system that is easy to use, simple in operation, and particularly well suited for the proposed usages thereof.

The substrate positioning system of the present invention comprises a linkage rotatably mounted to a base and an end effector member rotatably mounted to the linkage and configured for supporting a substrate. Means is provided to rotate the linkage and the member simultaneously as a robotic unit to move the substrate to a desired y-axis and z-axis location to facilitate performing certain processing on the substrate.

In another aspect, the processing performed on the substrate involves ion implantation. A chamber is provided into which an ion beam is entered, the ion beam configured to scan over the width of a substrate along an x-axis. Within the chamber is the linkage attached at a first rotary axis to the base and the end effector member attached at a second rotary axis to the linkage, the linkage and end effector member forming a substrate holder to position the substrate. A drive unit is mechanically connected to the linkage to scan the end effector and held substrate through the ion beam substantially in a z-axis direction. Because the end effector member rotates about the second rotary axis as the linkage rotates about the first rotary axis, a substantially constant angle of incidence of the ion beam on the substrate is maintained. The system can be further configured with the base being movable along the y-axis such that the system maintains a constant distance of travel for the ion beam incident on the substrate as the linkage and end effector member travel in a curved path.

Other advantages and components of the present invention will become apparent from the following description taken in conjunction with the accompanying drawings, which constitute a part of this specification and wherein are set forth exemplary aspects of the present invention to illustrate various features thereof.

DETAILED DESCRIPTION OF THE INVENTION

Figure 1:
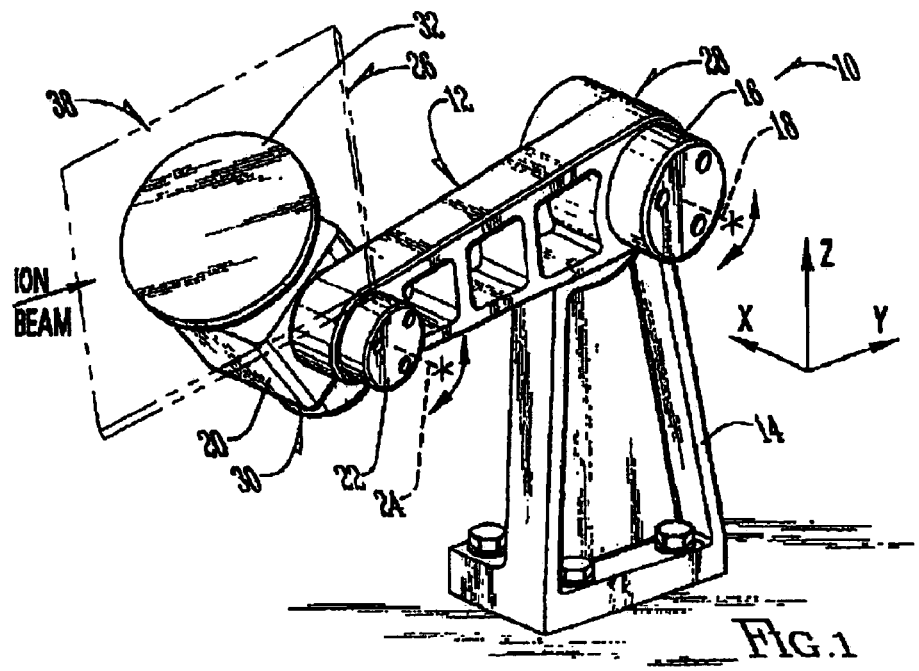
FIG. 1 is a perspective view an embodiment of the present invention showing a substrate mounted to the end effector member.
Figure 2:
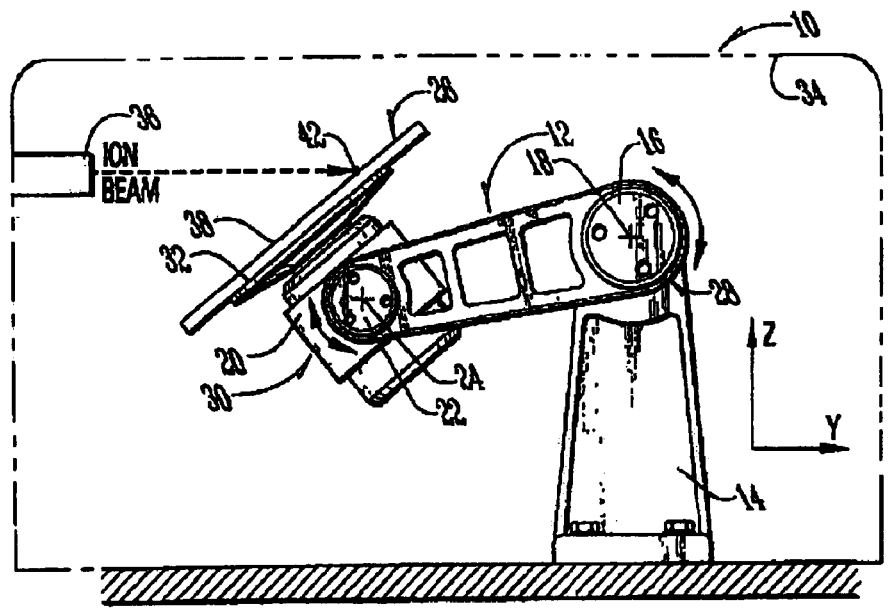
FIG. 2 is a side elevation view of the present invention according to the embodiment of FIG. 1.

The substrate positioning system 10 of the present invention is shown generally in FIGS. 1 and 2. The system 10 provides a linkage 12 rotatably mounted to a base 14 with a first rotary joint 16 at a first rotary axis 18 and an end effector member 20 rotatably mounted to the linkage 12 with a second rotary joint 22 at a second rotary axis 24 for properly positioning a substrate 26 for various processing. The first rotary axis 18 is located at a proximal end 28 of the linkage 12 and the second rotary axis 24 is located at a distal end 30 of the linkage 12. Both axes are aligned in parallel relationship to one another and extend generally parallel to the x-axis. Thus, the base 14 extends upward along the z-axis and the linkage 12 and end effector member 20 generally move in the y-z plane. Through the synchronized rotation of the linkage 12 about the base 14 and the end effector member 20 about the linkage 12, the system 10 acts as a robotic unit to move the substrate 26 to the desired location, through a known path at desired velocity.

The rotation of the linkage 12 and end effector member 20 about the first and second rotary axes 18, 24, respectively, can be accomplished by various means. The linkage 12 and end effector member 20 may be mechanically coupled using suitable linkages such as belts and pulleys (not shown), or may be independently controlled through motors (not shown) coupled to each of the linkage and the member. If motors are used, they are preferably mounted within the first and second rotary joints 16, 22. The linkage 12 is thus extended or contracted relative to the base 14 and the end effector member 20 is extended or contracted relative to the linkage 12. The motion of the linkage 12 and member 20 is in the y-z plane.

Although the system 10 can be used in a variety of ways, preferably, the substrate 26 is fixedly positioned on the end effector member 20 such that the system 10 moves the substrate through an ion beam for performing ion implantation. In this aspect, the end effector member 20 has a planar surface 32 upon which the substrate 26, such as a semiconducting wafer, is mounted. The surface 32 is aligned perpendicular to the length of the member 20 extending from the second rotary axis 24 to the surface 32, as best seen in FIG. 2. The linkage 12 is an elongate member having a length sufficient as to move the end effector member 20 and wafers 26 of various sizes vertically though the ion beam path. Mounting of the wafer 26 to the surface 32 is preferably accomplished by clamping the wafer thereon. Also, the wafer 26 is generally of the type with a surface area in the form of a disk with a diameter and center.

As seen in FIG. 2, the system 10 is contained within an evacuated enclosure 34 such that an environment conductive to ion beam transport and implantation is provided. The ion beam is introduced into the enclosure 34 from the end of an ion beam transport system 36, which is preferably at a fixed location and transmits the beam along the y-axis towards the wafer 26. As is known in the art, the ion beam is electronically scanned across the held wafer 26 along an axis (the x-axis) or in a fan shaped orientation. This provides an ion beam incident on the wafer 26 that is formed as an elongated shape to deliver uniform ion dosage across the width of the wafer in the x-axis, but does not provide an ion beam substantially across the wafer height, perpendicular to the x-axis. The movement of the end effector member 20 mechanically scans the wafer 26 through the ion beam along an axis perpendicular to the electronically scanned ion beam such that an entire wafer surface 38 may be uniformly ion implanted. The velocities of the mechanical scan preferably move the wafer 26 through the ion beam on the order of at least 10 inches per second.

To ensure that the proper ion dosage is applied to the wafer 26, the planar surface 32 of the end effector member 20 is maintained at a constant angle of incidence, or implant angle, with the ion beam throughout the mechanical scan. The implant angle can be set at any angle between 0 and 90 degrees depending on the desired ion dosage characteristics. This is accomplished by the coordination of the rotation of the linkage 12 and end effector member 20. Because the rotation of the linkage 12 about the first rotary axis 18 causes the linkage distal end 30 to rotate, the second rotary axis 24 must simultaneously counter-rotate in a synchronous fashion to ensure that the end effector member 20 and surface 32 upon which the wafer 26 is affixed remain properly oriented at the chosen implant angle. The first and second rotary axes 18, 24 are coordinated to rotate in opposite directions (clockwise and counter-clockwise) to properly orient the end effector member 20. Further, the axes 18, 24 rotate with equal but opposite angular magnitude, or degree of rotation, to maintain the constant implant angle. Motors, belts and pulleys, or other means are implemented to rotate the linkage 12 and end effector member 20 about the axes 18, 24. Also, logic circuits and/or processors may be electrically connected to the means for rotating the linkage 12 and member 20 to accomplish the programmed coordination of the rotation. Additionally, other factors such as the mechanical scan velocity, the ion beam current, or the duty cycle of the electronic scan, may be individually or simultaneously adjusted to provide the proper ion dosage.

The vertical component of the mechanical scanning is accomplished through the rotation of the linkage 12 about the base 14, which is a structure with a fixed position relative to the z-axis. The wafer 26 may be moved several times through the ion beam such that all portions of the wafer surface 38 receive the adequate ion beam dosage. The function of the end effector member 20 is thus to provide a secure platform for the wafer 26 for orientation at the desired implant angle throughout these scans.

Figure 3:
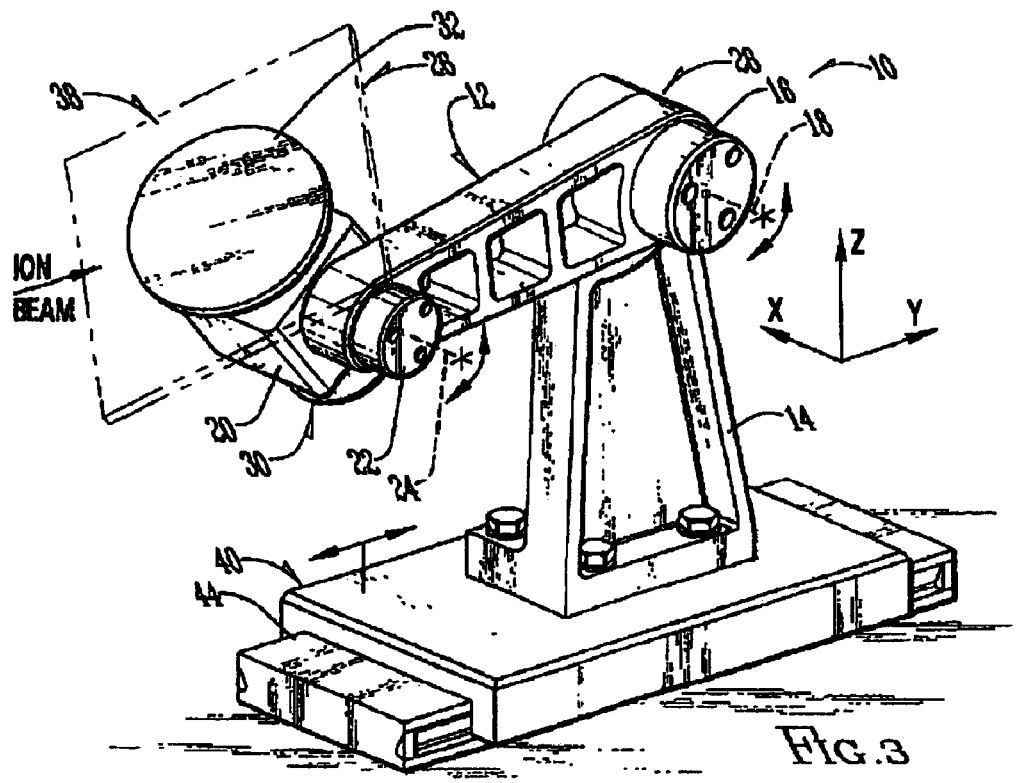
FIG. 3 is a perspective view of another embodiment of the present invention showing the base being movable along a linear slide.
Figure 4:
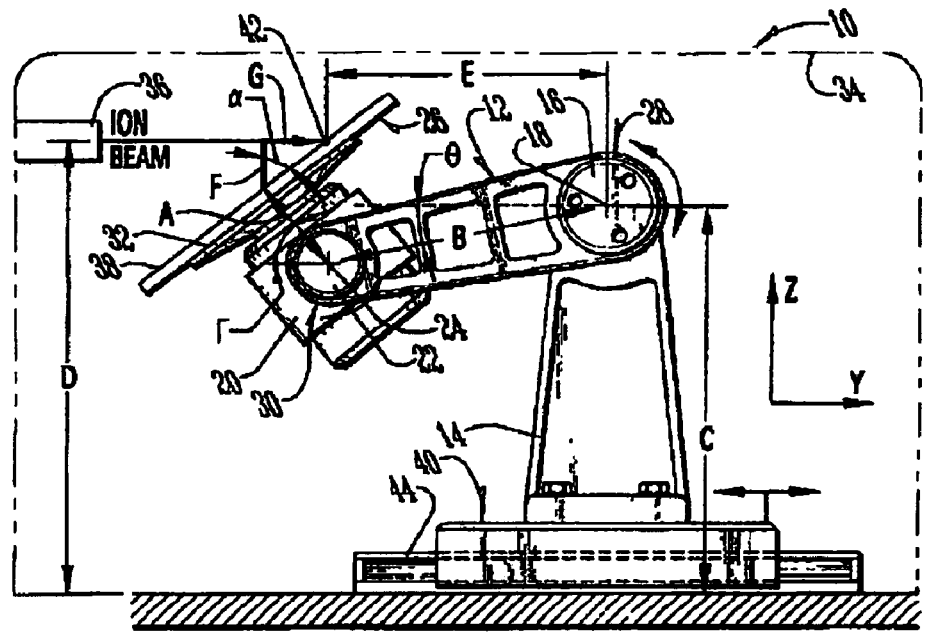
FIG. 4 is a side elevational view of the present invention according to the embodiment of FIG. 3.

In another aspect shown in FIGS. 3 and 4, the base 14 of the system 10 may be provided with a means for linearly moving the base 40 such that the horizontal distance along the y-axis between the ion beam transport system end 36 and the impact point 42 of the beam on the wafer surface 38 remains constant throughout the mechanical scan. Preferably, the means 40 for moving the base 14 is a linear slide that moves within a track 44. Because rotation of the linkage 12 about the base 14 causes the linkage distal end 30 and end effector member 20 mounted thereto to follow a curved path, the wafer surface 38 moves both vertically along the z-axis and horizontally along the y-axis. The movement of the linear slide 40 allows the base 14, and thus the linkage 12 and member 20 coupled thereto, to counteract the y-axis component of the holder 20 rotation and facilitate the translation of the impact point 42 on the wafer surface 38 moving substantially only in the z-axis. The intensity of the ion beam reaching the wafer surface 38 is maintained as the surface is moved through the beam.

Assuming that the wafer 26 is affixed to the substrate surface 32 such that the wafer surface 38 is orthogonal to the end effector member 20 length and the ion beam travels in a parallel line with the y-axis, the formula for calculating the necessary linear movement of the base 14, or correction factor, can be calculated. First, the necessary beam travel distance from the ion beam transport system end 36 to the impact point 42 on the wafer surface is determined. The base 14 is moved such that the wafer 26 is properly positioned for the necessary beam travel. A correction factor K is determined by the difference of a constant E1, which is the y-axis distance from the first rotary axis 18 to the beam impact point 42 on the wafer surface 38 at the starting point of the ion scan, and the y-axis distance E from the first rotary axis 18 of the base to the beam impact point 42 on the wafer surface 38 as the linkage 12 and end effector member 20 are rotated. Thus, the correction factor K is calculated as:

$$K = E1 - E;$$

wherein: K is a positive value when the ion beam impact point 42 has moved further from the ion beam transport system end 36 and a negative value when the beam impact point has moved closer to the beam output location.

If the linkage 12 and the end effector member 20 extend parallel to the y-axis, the distance E is determined to be:

$$E = A + B;$$

wherein: A is the length of the end effector member 20 from the second rotary axis 24 to the substrate 26 affixed thereto, plus the thickness of the substrate; and B is the length of the linkage 12 from the first rotary axis 18 to the second rotary axis.

When the linkage 12 and end effector member 20 are rotated about the first and second rotary axes, 18, 24, respectively, to move the substrate 26 through the ion beam, the cosine of the angles formed with the y-axis must be determined. Thus, for an implant angle of 0 degrees, the distance E is determined by:

$$E = A(\cos \Gamma) + B(\cos \theta);$$

wherein: $\theta$ is the angle between the linkage 12 and the y-axis at the first rotary axis 18, positively measured above the z-axis; and $\Gamma$ is angle between the end effector member 20 and the y-axis at the second rotary axis 24, positively measured above the y-axis. However, because $\Gamma$ is equal to the implant angle (because the wafer surface is orthogonal to the end effector length), the value of $\Gamma$ is zero and the equation reduces to:

$$E = A + B(\cos \theta).$$

The correction factor is then calculated to be:

$$K = E1 - (A + B(\cos \theta)).$$

The determination of the correction factor changes when an implant angle of greater than zero but less than 90 degrees is introduced. The distance E must not only take into account the relationship between the cosine of the angles formed between the linkage 12 and end effector member 20 with the y-axis, but also the z-axis position at which the ion beam impacts the wafer surface 38. To offset from the position of the wafer 26 at the centerline 44 of the end effector length to the beam impact point 42, the following relationship is observed:

$$\tan(\alpha) = G/F \text{ or } G = F \cdot \tan(\alpha);$$

wherein: $\alpha$ is the implant angle between the wafer surface 38 and the z-axis measured at the ion beam impact point 42; F is the z-axis distance from the wafer surface 38 at the centerline of the end effector length 44 to the beam impact point; and G is the y-axis distance from the wafer surface at the centerline of the end effector length to the beam impact point. Thus, knowing the implant angle $\alpha$ and the distance F, the distance G can be determined and added to the cosine of the linkage and end effector member angles to determine E. The distance F is calculated from:

$$F = C + B(\sin \theta) + A(\sin \theta) - D;$$

Wherein: C is the z-axis distance from a reference x-y plane upon which the base 14 is positioned to the first rotary axis 18; and D is the z-axis distance from the reference x-y plane to the ion beam transport system end 36. The distance E is calculated from:

$$E = A(\cos \Gamma) + B(\cos \theta) + G;$$

Therefore, E is determined to be:

$$E = A(\cos \Gamma) + B(\cos \theta) + \tan(\alpha) \cdot [A(\sin \Gamma) + B(\sin \theta) + C - D];$$

and the correction factor is then calculated to be:

$$K = E1 - A(\cos \Gamma) + B(\cos \theta) + \tan(\alpha) \cdot [A(\sin \theta) + B(\sin \theta) + C - D].$$

Knowing the correction factor, logic circuits and/or processors may be electrically connected to the means 40 for linearly moving the base 14 in a y-axis direction such that the base is linearly moved based on the calculated correction factor to thereby maintain a constant travel distance for the ion beam from an ion beam transport system end 36 to ion beam impact point 42 on the substrate surface 38.

From the foregoing information, it should now be obvious that the substrate positioning system 10 provides a simple and efficient solution for accurately positioning a substrate to facilitate the performing of certain processing on the substrate, such as ion implantation. The system is ideally configured to move the substrate vertically along a z-axis through an ion beam scan while reducing or eliminating y-axis horizontal motion of an ion beam impact location on the held substrate. In this way, the proper amount of ion beam dosage is delivered evenly over the surface of the substrate. It is also to be understood that the terms used herein relating to vertical dimensions along the z-axis and horizontal dimensions along the y-axis are relative, and the system can be rotated in any of the x, y, or z axes such that vertical and horizontal orientations would be changed accordingly. While certain forms of the present invention have been illustrated and described herein, it is not to be limited to the specific forms or arrangement of parts described and shown.

What is claimed is:

1. A substrate positioning system, comprising:
   a base;
   a linkage coupled to the base for rotation about a first rotary axis; and
   an end effector member for supporting a substrate and coupled for rotation to the linkage about a second rotary axis that is parallel to the first rotary axis;
   wherein rotation of the linkage and counter-rotation of the end effector member translates the substrate through an ion beam such that a surface of the substrate scans through the ion beam at a constant angle of incidence.

2. The positioning system of claim 1, further comprising a motor mounted within one or both of (a) a rotary joint coupling the linkage to the base and (b) a rotary joint coupling the end effector member to the linkage.

3. The positioning system of claim 1, wherein the linkage and the end effector member are mechanically coupled to effect the counter-rotation in response to the rotation.

4. The positioning system of claim 1, further comprising a logic circuit to control the rotation of the linkage and the counter-rotation of the end effector member.

5. The positioning system of claim 1, further comprising a processor to control the rotation of the linkage and the counter-rotation of the end effector member.

6. The positioning system of claim 1, wherein the constant angle of incidence is an angle within a range of zero to ninety degrees.

7. The positioning system of claim 1, wherein the first rotary axis is fixed in position along a z-axis, wherein the first and second rotary axes are along an x-axis, and wherein the ion beam substantially travels along a y-axis.

8. The positioning system of claim 7, wherein the base is configured for movement along the y-axis such that the ion beam travels a substantially constant distance to the surface.

9. The positioning system of claim 8, wherein the movement is determined by:

$$K=E1-A(\cos \Gamma)+B(\cos \theta)+\tan (\alpha)\cdot(A(\sin \Gamma)+B(\sin \theta)+C-D),$$

wherein

K is a linear distance of travel of the base to maintain the constant distance,

E1 is y-axis distance measured from the first rotary axis to an ion beam impact point on the surface when the substrate is positioned at a desired distance from an ion beam output location, A is a length of the end effector member from the second rotary axis to the substrate affixed thereto plus the thickness of the substrate, B is a length of the linkage from the first rotary axis to the second rotary axis, C is z-axis distance from a reference x-y plane to the first rotary axis, D is z-axis distance from the reference x-y plane to the ion beam output location, θ is an angle between the linkage and the z-axis at the first rotary axis, positively measured above the z-axis, Γ is an angle between the end effector member and the z-axis at the second rotary axis, positively measured above the z-axis, and α is the angle of incidence, measured between the substrate surface and the z-axis at the ion beam impact point and having a fixed value between 0 and 90 degrees.

10. A method of positioning a substrate for ion implantation, comprising:

directing an ion beam towards a substrate positioned on an end effector member; and translating the substrate past the ion beam by:

rotating a linkage coupled to a base about a first rotary axis while counter-rotating the end effector member coupled to the linkage about a second rotary axis, to maintain a constant angle of incidence of the ion beam upon a surface of the substrate.

11. The method of claim 10, wherein one or both of the steps of rotating and counter-rotating comprising utilizing a motor within a rotary joint.

12. The method of claim 10, the step of counter-rotating the end effector member comprising utilizing mechanical coupling between the linkage and the end effector member.

13. The method of claim 10, further comprising the step of adjusting at least one of an ion beam current, a duty cycle of an ion beam scan, and a mechanical scan velocity to produce a constant dose of ions across the surface.

14. The method of claim 10, further comprising the steps of:

calculating a required movement of the base to maintain a constant travel distance for the ion beam, determined by:

$$K=E1-A(\cos \Gamma)+B(\cos \theta)+\tan (\alpha)\cdot(A(\sin \Gamma)+B(\sin \theta)+C-D),$$

wherein

K is a linear distance of travel of the base to maintain the constant distance,

E1 is y-axis distance measured from the first rotary axis to an ion beam impact point on the surface when the substrate is positioned at a desired distance from an ion beam output location, A is a length of the end effector member from the second rotary axis to the substrate affixed thereto plus the thickness of the substrate, B is a length of the linkage from the first rotary axis to the second rotary axis, C is z-axis distance from a reference x-y plane to the first rotary axis, D is z-axis distance from the reference x-y plane to the ion beam output location, θ is an angle between the linkage and the z-axis at the first rotary axis, positively measured above the z-axis, Γ is an angle between the end effector member and the z-axis at the second rotary axis, positively measured above the z-axis, and α is the angle of incidence, measured between the substrate surface and the z-axis at the ion beam impact point and having a fixed value between 0 and 90 degrees; and moving the base along the y-axis by the amount K, such that the ion beam travels a substantially constant distance to the surface.

15. A substrate positioning system, comprising:

a linkage coupled to a base for rotation in a y-z plane about a first rotary axis that is fixed along a z-axis; and an end effector member for supporting a substrate thereon and coupled to the linkage for counter-rotation about a second rotary axis;

the rotation and the counter-rotation being controlled to (a) scan a surface of the substrate through an ion beam that travels generally in a y-axis and that scans in an x-y plane and (b) maintain a constant angle of incidenct between the surface and the ion beam, to facilitate ion implantation of the substrate.

16. The substrate positioning system of claim 15, the base configured to move along the y-axis to maintain a constant travel distance for the ion beam, to an impact point on the substrate.

* * * * *